United States Patent [19]

Ghate et al.

[11] 4,242,698
[45] Dec. 30, 1980

[54] MAXIMUM DENSITY INTERCONNECTIONS FOR LARGE SCALE INTEGRATED CIRCUITS

[75] Inventors: Prabhakar B. Ghate, Dallas; Arthur M. Wilson, Richardson; Clyde R. Fuller, Plano, all of Tex.

[73] Assignee: Texas Instruments Incorporated, Dallas, Tex.

[21] Appl. No.: 847,956

[22] Filed: Nov. 2, 1977

[51] Int. Cl.³ ............................................. H01L 23/48
[52] U.S. Cl. ....................................... 357/71; 357/67; 357/68
[58] Field of Search .............................. 357/68, 67, 71

[56] References Cited

U.S. PATENT DOCUMENTS

| | | | |
|---|---|---|---|
| 3,936,865 | 2/1976 | Robinson | 357/71 |
| 4,042,953 | 8/1977 | Hall | 357/71 |
| 4,151,545 | 4/1979 | Schnepf et al. | 357/71 |

*Primary Examiner*—Edward J. Wojciechowicz
*Attorney, Agent, or Firm*—Gary C. Honeycutt; Richard L. Donaldson; Mel Sharp

[57] ABSTRACT

A microelectronic integrated circuit having first and second levels of thin-film metallization separated by an insulation layer is provided with a system for electrical interconnections between metallization levels, at selected locations, without requiring extra spacing between metal paths, in either the first or second levels. Maximum circuit density is thereby permitted, with no restriction on the placement of interconnection vias. Circuit layout is greatly simplified because all metal paths have uniform widths and minimum spacings, achieved with the use of vias that are "oversized" in both the transverse and longitudinal directions. Consequently, it is required that second level metal differ in composition from first level metal, and be patterned with an etchant that does not attack first level metal.

8 Claims, 7 Drawing Figures

MAXIMUM DENSITY INTERCONNECTIONS FOR LARGE SCALE INTEGRATED CIRCUITS

FIG. 1b is a cross section of the circuit of FIG. 1a.

FIG. 2b is a cross section of the circuit of FIG. 2a.

FIGS. 3b and 3c are cross sections of the circuit of FIG. 3a.

This invention relates to plural level interconnection systems for integrated circuits, and more particularly to a structure and method for making contacts between metal interconnection levels. Increased circuit densities and increased production yields are achieved by using vias that are "oversized" in both directions, in combination with a second level metal that can be selectively etched in the presence of first level metal.

The history of integrated semiconductor circuit design has been characterized by a well-known trend toward increased circuit densities. For large scale integrated (LSI) circuits one of the limiting factors in determining circuit densities has been the spacing requirement between adjacent thin film metal interconnection paths patterned on the passivation layer which coats the semiconductor surface. So long as all metal interconnections paths can be located on a single level, i.e., directly on the passivation layer, the metal strips typically have a uniform width of about 0.3 mil and are spaced apart from adjacent strips by about 0.25 mil.

With the increased complexity of LSI, a large number of components such as diodes, transistors, resistors, capacitors and so on need to be interconnected on a bar to achieve the desired function of the IC's, the bar area generally increases faster than the number of components because a disproportionately larger area is required for single level interconnections. When the bar area becomes so large that production of these integrated circuits (IC's) becomes prohibitive because of low yields, multilevel interconnection systems offer the desired solution of reducing the bar area and also of achieving higher packing density of the components. This results in high performance circuits.

Figure 1A:
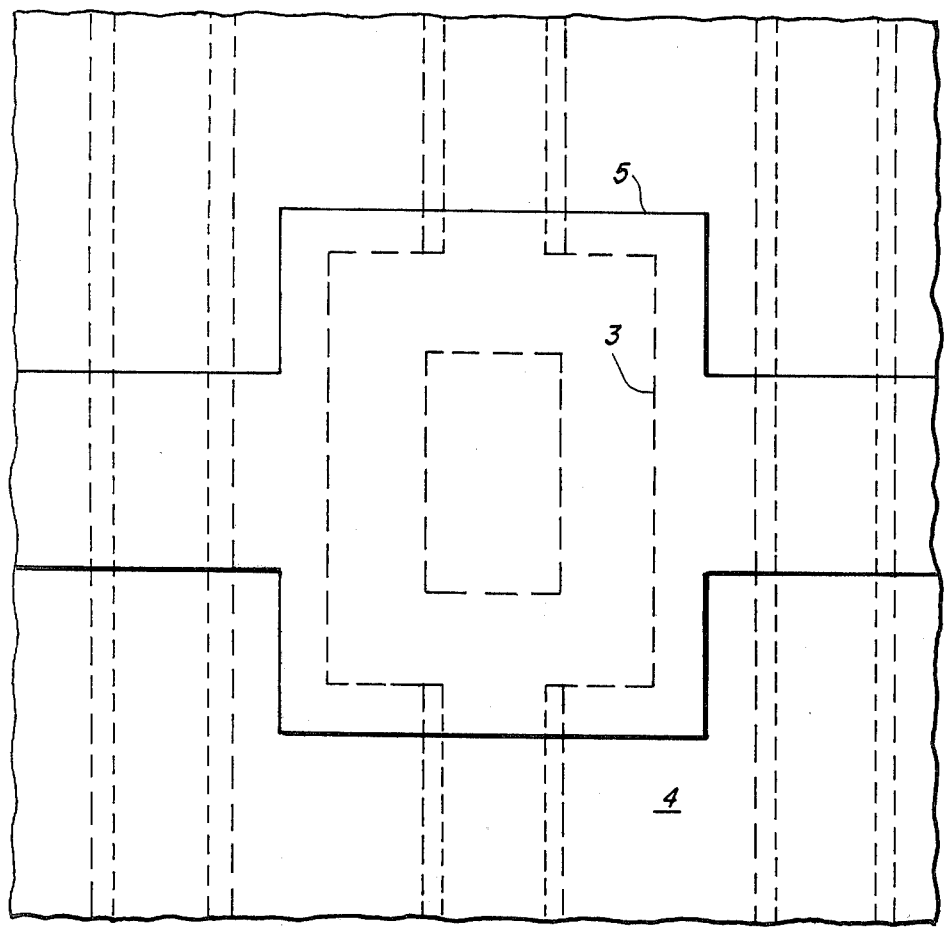
FIG. 1a is a fragmentary plan view of an integrated circuit, showing a standard interconnection between metal levels.
Figure 1B:
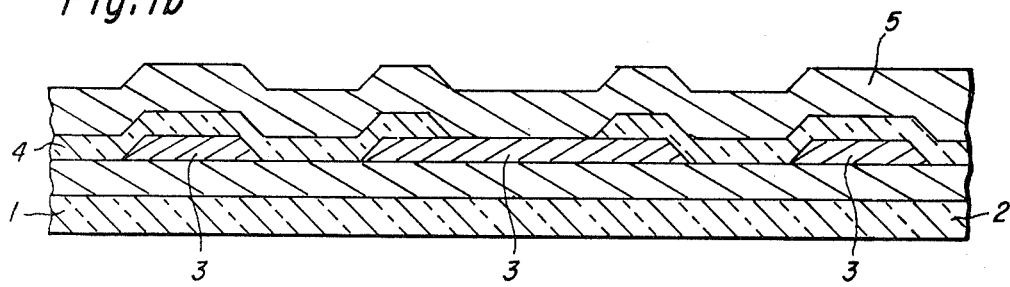

The use of a two-level interconnection system (a special case of multilevel interconnection system) for a given IC reduces the bar area from that of a similar IC fabricated with single level interconnections. Even though the actual reduction in the bar area depends on the complexity of the IC, a 30 to 40% reduction in the area is considered to be typical for an IC designed with a two-level interconnection system as shown in FIGS. 1a and 1b.

When a second level of metallization is required, the spacing requirements at the first level are complicated by the requirement that a metal pad of expanded area must be provided at each location where contact is to be made with second level metallization. The requirement for expanded area pads is twofold: one reason is to provide a tolerance for mask misalignment when opening the via hole through the insulation between first and second level metal, and the other reason is to provide an etch stop, so that the passivation layer beneath first level metallization will not be attacked when opening the via hole between metal levels.

Thus it would be desirable in the design of multilevel metallization for LSI circuits to be able to retain the same spacing for first level of metallization as in IC's with single level interconnections, and also to be able to fabricate the second level interconnections as closely spaced as possible without sacrificing any additional area on the bar for providing level-to-level contacts at the vias. Accordingly, it is the object of the present invention to eliminate the expanded area pads characteristic of nested vias without sacrificing the advantages for which the pads were originally developed, and also to eliminate the necessity of oversized second level metal pads covering the underlying vias.

The key features of the invention are (1) a via that is "oversized" in both the transverse and longitudinal directions, and (2) no restriction on the second level metal to cover the oversized via, by a proper selection of the first and second level metal systems, thereby providing the maximum interconnection density for the first and second level interconnections, consistent with patterning techniques.

In the prior art of forming two-level interconnections, as shown in FIGS. 1a and 1b, metal film interconnections of uniform width 0.3 mil ($\sim 8.5$ $\mu$m) are spaced apart from adjacent (strips) interconnections by about 0.25 mil ($\sim 6.25$ $\mu$m). An example is the use of aluminum film interconnections for the first level. An insulation layer such as $SiO_2$ is deposited by any one of the techniques such as plasma, sputtering, chemical vapor deposition and so on. In order to achieve level-to-level contacts, vias (or holes) are to be opened in the insulating layer. In the conventional insulator (oxide) removal technique used for opening up vias, the etchant used to remove the silicon oxide layer which passivates the semiconductor surface. In order to avoid such an attack, an underlying metal pad is provided so that a via can be located totally within the boundaries of this pad. The metal pad is 0.15 mil oversize on each side of the via. The underlying metal pad has to be an effective etch stop for oxide etchants. It is well known that aluminum acts as an effective etch stop for oxide etchants. Subsequent to the via formation a second level metal usually the same as the first level metal, in this case Al, is deposited and the second level interconnections are photolithographically defined. The patterns are chemically etched with suitable etch resistant masking on the metal. In order to protect the first level leads in the present example Al, being attached by the etch and developing open leads during the etching operation of the second level leads, in this case Aluminum, the second level metal pad over the via is designed to overlap the via by as much as 0.1 mil on each side of the underlying first level metal pad. In the prior art, the second level strips are 0.4 mil wide and spaced 0.4 mil apart from the adjoining strip. A second level metal pad covering a via of $0.3 \times 0.5$ $mil^2$ is shown in FIGS. 1a and 1b.

Figure 2A:
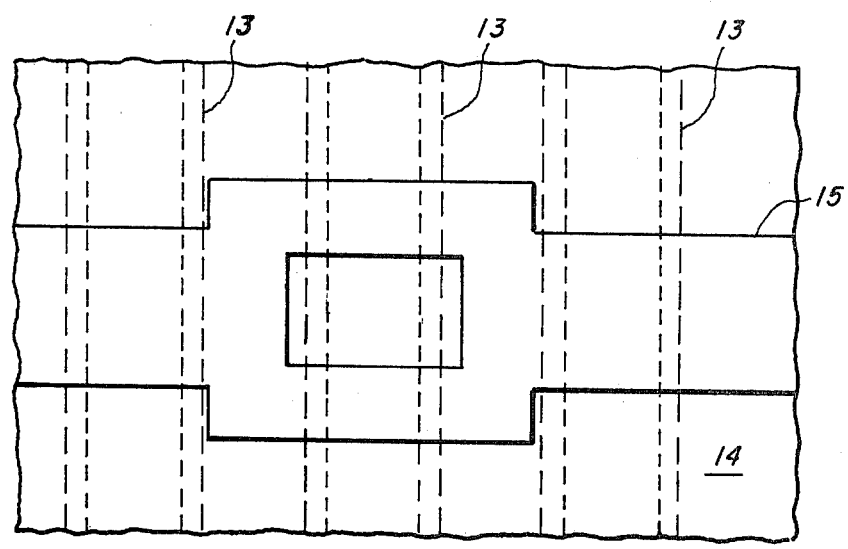
FIG. 2a is a fragmentary plan view of an integrated circuit, showing an oversized via interconnection between metal levels.
Figure 2B:
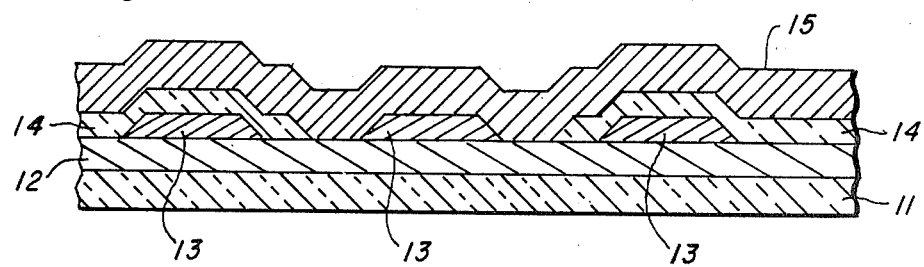

With the development of the "oversized vias" the restriction of the underlying metal pad can be eliminated by providing a non-metallic etch stop under the first level metal at via locations. In the oversize via configuration, the via is actually wider than the underlying first level metal, whereby the second level metal, when deposited, will contact both top and side portions of the underlying metal strip and also contact the passivation layer exposed by the via on each side of the first level metal strip. Such a configuration not only permits the closest possible spacing of first level metal patterns but also improves processing yields due to the combination of top and side surface bonding first and second metal levels. This configuration is possible because the etch stop under the first level metal at via location makes it possible to use conventional oxide etchants (HF as a primary chemical agent) to open up the vias without attacking the silicon oxide layer that passivates the devices. In the "oversized via" development, the second level metal pad covers the entire via and it is oversized by 0.1 mil on each side. The second level interconnections are 0.4 mil wide and are paced 0.4 mil apart from the adjacent strip. An oversized via configuration is schematically shown in FIGS. 2a and 2b. An example of a process sequence for achieving two level interconnections with oversized vias can be described as follows: (a) An insulating layer such as silicon nitride is plasma deposited and is patterned to permit the formation of metal to silicon contacts. This nitride layer serves as a nonmetallic etch stop for vias, in subsequent processing. (b) Suitable metal to silicon contacts are formed. e.g. PtSi contacts. (c) A first level interconnection pattern is formed with TiW-Al; TiW acts as a barrier layer and Al acts as the conductor path; if PtSi contacts are not desired steps (b) and (c) can be achieved with single layer of Aluminum. (3) An interlevel insulation layer such as SiO$_2$ is plasma deposited; vias are etched in the oxide to permit level-to-level interconnection; the silicon nitride etch stop protects the underlying silicon oxide layer which passivates the devices. (e) Aluminum film is deposited on the entire surface of the slice and the second level interconnections are defined by appropriate masking and etching techniques. The second level metal pad covering the via protects the first level metal lead from being attacked by the etch used in defining the second level leads. Such an oversized via configuration permits the closest spacing of first level leads and a considerable reduction in bar area is realized even though the design rules of the second level interconnection width and spacing impose some restriction on the via placement.

Figure 3A:
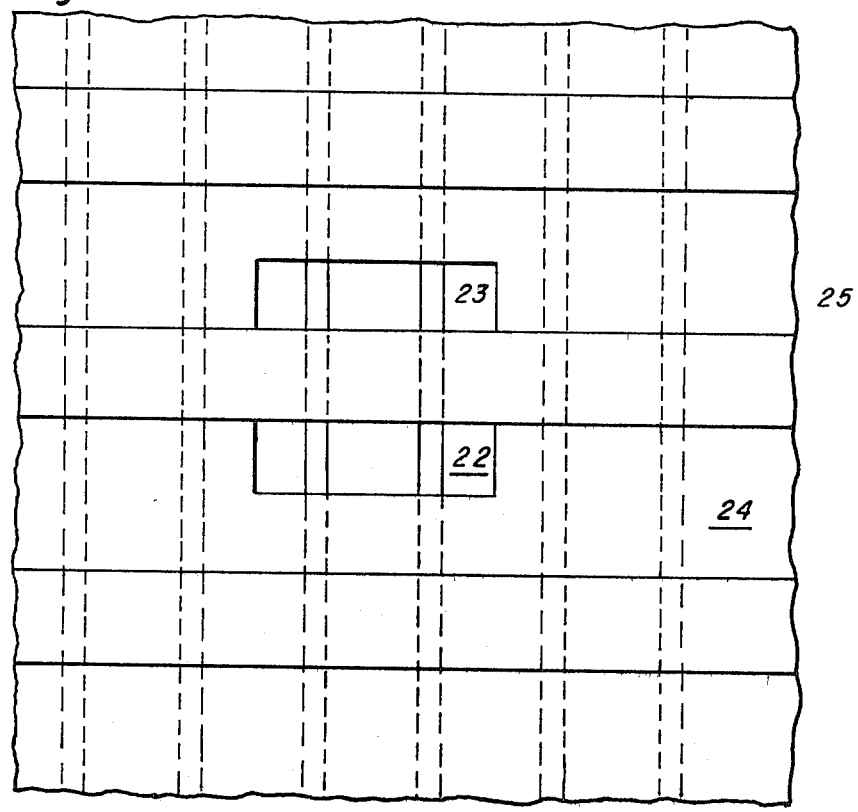
FIG. 3a is a fragmentary plan view of an integrated circuit, showing the configuration of the present invention for an interconnection between metal levels.
Figure 3B:
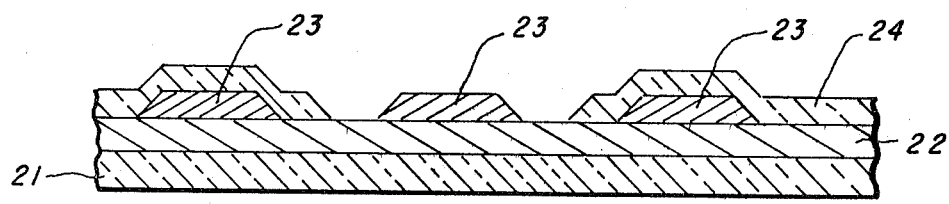
Figure 3C:
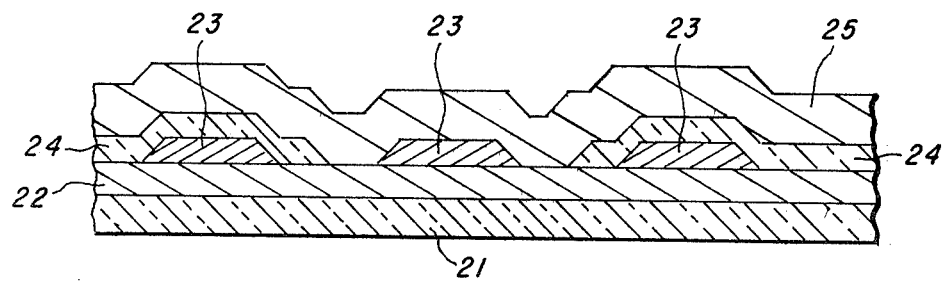

It would be highly desirable to use a two-level interconnection system which is consistent with imaging and patterning techniques, but imposes no restriction on the via placement and requires no additional bar area for a via placement. Such an interconnection system will then permit the maximum packing density of the components with minimum area allocated for interconnections. This invention permits the fabrication of such a two-level interconnection system with maximum packing density permissible with circuit design and not restricted by via placement. Such an interconnection system is fabricated by an oversize via with no restriction on the second metal pad to cover the via, and either by using two different metals, $M_1$ and $M_2$, with dissimilar etching characteristics for the first and second level interconnections or by using a barrier metal layer ($M_3$) between the first and second level interconnections fabricated with the same metal ($M_1$). It is also required that the second level pad need not cover the via, thus permitting the closest spacing of second level interconnections. The exposed first level in the via is not attacked by the etchant used to etch the top layer of second level metal. If the same metal is used for both levels of interconnection, the barrier layer protects the first level during the etching of the second level and the barrier layer is subsequently etched off without attacking the first or second level interconnections. A schematic sketch of this two-level metal interconnection is shown in FIGS. 3a, 3b and 3c.

The following process sequence illustrates a preferred embodiment of the herein-disclosed invention:

(1) On a clean semiconductor substrate having all discrete devices previously formed, a silicon nitride layer is plasma deposited on the silicon oxide layer that passivates the underlying devices; this silicon nitride layer is patterned so as to permit the formation of metal to silicon contacts. The silicon nitride acts as an effective etch stop at via locations during via etching.

(2) The silicon slices are cleaned and a metal film of pure or doped aluminum film is vacuum deposited and first level interconnections are defined by photolithographic and etching techniques. It is desirable to achieve sloped edges for the first level leads.

(3) The slices are cleaned and an insulator such as SiO$_2$ of good thickness uniformity is deposited by anyone of the techniques by the reaction of SiH$_4$ and N$_2$O or CO$_2$ in an RF plasma.

(4) Holes or vias are etched in this insulator at desired locations to provide the level-to-level interconnection. An oversize via is employed. The via is wider than the first level lead on one side and wider than the second level metal on the other side. If $W_1$ and $W_2$ are the widths of the first and second level interconnections spaced $d_1$ and $d_2$ apart on their respective levels, a typical via of sides $(W_1+\Delta_1)$ and $(W_2+\Delta_2)$ can be placed at the desired location. Here $0 \leq \Delta_1 < \frac{3}{4}d_1$ and $0 \leq \Delta_2 \leq \frac{3}{4}d_2$. $\Delta_1 = d_1/2$ and $\Delta_2 = d_2/2$ will be considered desirable for accomodating the level-to-level misalignment in imaging. An ideal condition would be to have the same width and spacing for first and second level interconnections and a square via of side $(W_1+d_1/2)$. For the case with 0.3 mil line width and 0.25 mil spacing a swuare of 0.425 mil on each side is considered desirable. The vias are etched with conventional oxide etches and the underlying silicon nitride will serve as an effective etch stop. A via etch process is chosen such that vias are not overetched so as to expose the adjoining leads. This via etching process can be accomplished by methods (such as plasma etching or sputter etching) other than wet etching so long as the silicon nitride layer acts as an effective etch stop.

(5) The slices are cleaned and loaded into a vacuum chamber. The slices are sputter cleaned or ion milled or plasma cleaned in situ and then a layer of barrier metal such as TiW is deposited. After this TiW layer of suitable thickness e.g. 2000 Å is deposited, an aluminum film is deposited in the same chamber by any of the deposition techniques. If such equipment is not readily available, the slices are removed from the vacuum chamber after TiW deposition and loaded into a second vacuum chamber where the second level metal deposition is completed.

(6) The second level metal interconnection pattern can be etched in aluminum. The first level aluminum lead exposed in the via will not be attacked by the etchant used to define the second level interconnection of Al because TiW acts as a barrier for this etchant and TiW layer will protect the first level Al.

(7) After the aluminum etching is complete, the TiW layer is etched off using a Hydrogen peroxide solution. The second level metal interconnection will protect the underlying TiW.

(8) The slices are cleaned and the fabrication of the two-level interconnections is considered completed. In some instances the slices are subjected to an elevated temperature somewhere in the 300° to 550° C. range to promote level-to-level contact at the vias. In the process described here the use of an in situ via sputter clean eliminates the need of such a contact bake.

An alternate process without the use of a barrier layer such as TiW is illustrated as follows: A metal such as W is employed for the first level metal and the second level interconnections are fabricated out of Al films. The etchants used for defining the second level Al leads do not attack the W lead exposed in the via. In the selection of these two dissimilar metals, for the first and second level interconnections, process compatibility and their stability needs to be comprehended.

The impact of this disclosure is a novel approach to the design of two-level interconnections consistent with patterning techniques but with not restrictions on the via placement. This approach permits the closest spacing of first and second level interconnections resulting in the maximum packing density of components on a bar with minimum space utilization for interconnections. The oversize via can be placed at any location where a first to second level connection is desired. Such an approach will make the circuit layout job considerably simpler because the interconnections can be laid out as lines of uniform width. Automated design systems will find this two level interconnection system facilitate their task of circuit design. This is true because a nodal matrix approach can be used similar to what is used in computer aided design of multilevel circuit broad layouts. For example, 0.55 mil repeat leads on first and second level provides 0.30 mil$^2$ per via or 110,000 potential vias on a 30,000 mil$^2$ bar. A maximum packing density of components makes a better utilization of the bar area and higher yields are anticipated with small bars. It should be recognized that this system can be easily fabricated by employing two dissimilar metals $M_1$ and $M_2$ for the first and second level interconnections with their respective etchants not attacking the other metal. If the same metal is desired for the first and second level interconnections the use of a suitable barrier metal between the first and second metal that can protect the exposed first level metal in the via will serve the same purpose of having two dissimilar metals. However, the use of two dissimilar metals provide the added capability of rework at the second level metal patterning step.

The maximum packing density of components is realized by using the same widths and spacing "W" and "d" for the first and second level interconnections. A square oversize via, e.g. side (W+d/2) does not affect the closest spacing of the first and second level interconnections.

The structure of FIGS. 1a and 1b includes monocrystalline silicon substrate 1, silicon oxide passivation layer 2, first level aluminum metallization pattern 3, insulation layer 4, and second level aluminum pattern 5.

The structure of FIGS. 2a and 2b includes monocrystalline silicon substrate 11, silicon oxide passivation layer 12, first level metal pattern 13, insulation layer 14, and second level metal pattern 15.

The structure of FIGS. 3a, 3b, and 3c includes monocrystalline silicon substrate 21, silicon oxide passivation layer 22, first level metal pattern 23, insulation layer 24, and second level metal pattern 25.

A suitable etch for selectively patterning aluminum in the presence of nickel, tungsten, or titanium-tungsten mixtures is an aqueous solution of tetramethylammonium hydroxide. Also, in the presence of tungsten or titanium-tungsten, aluminum is selectively etched by an aqueous solution of nitric, phosphoric and acetic acids, in a ration of 1:30:5, for example.

What is claimed is:

1. A semiconductor device, including a double level metal interconnect system having a surface insulator on the semiconductor; and an inter-level insulator between metal levels, wherein the device surface insulator embodies a via etch stop layer, the first level metal is an adherent metal of a high conductivity and not appreciably attacked by aluminum etchants; the inter-level insulator is silicon dioxide; the apertures in the inter-level insulator have longitudinal and transverse dimensions which exceed the width of the first and second level metal leads by at least 10% of the space between adjacent leads, the second level interconnect is aluminum, and the spacing between leads is substantially the same at all locations on the device.

2. A device as claimed in 1 wherein the first level metal is PtSi covered by a layer of a refractory metal barrier comprising a, Ti:W mixture and by a layer of Al doped with 1.5 to 2.5% Cu, and the second level metal is Ti:W mixture covered by a layer of Al.

3. A device as in claim 2 wherein the second level metal is Ti:W covered by Au, Ti:W covered by Ag, or Tl:W covered by Palladium.

4. A device as in claimed in 2 wherein the refractory metal barrier is Ni, Cr, W, Ti, Ta, or Vanadium.

5. A device as in claim 1 wherein the first level metal is silicon (1-2%) doped Aluminum and the 2nd level metal is selected from Ti:W covered by Au, Ti:W covered by Ag, and Ti:W covered by Pd.

6. A double level interconnect system as claimed in 1 and the first level interconnect is polysilicon and the second level interconnect is pure aluminum or silicon and /or 1.5-2.5% copper doped aluminum.

7. A double level interconnect system as claimed in claims 1, 2, 3, 4, 5 or 6 wherein the interlevel insulator is a high temperature chemical vapor deposited silicon dioxide, or a sputtered quartz, or plasma vapor deposited silicon nitride, or any combination of these.

8. A double level interconnect system as claimed in 6 wherein the inter level insulator is a chemical vapor deposited silicon dioxide deposited at temperatures in excess of 500° C.

* * * * *